(12) United States Patent
Koteles et al.

(10) Patent No.: US 7,019,893 B2
(45) Date of Patent: Mar. 28, 2006

(54) OPTICAL DYNAMIC GAIN AMPLIFIER

(75) Inventors: Emil S. Koteles, Ottawa (CA); Michael Davies, Ottawa (CA); Jian-Jun He, Ottawa (CA)

(73) Assignee: MetroPhotonics Inc., Ottawa (CA)

( * ) Notice: Subject to any disclaimer, the term of this patent is extended or adjusted under 35 U.S.C. 154(b) by 537 days.

(21) Appl. No.: 10/073,083

(22) Filed: Feb. 12, 2002

(65) Prior Publication Data

US 2002/0109908 A1    Aug. 15, 2002

Related U.S. Application Data

(60) Provisional application No. 60/267,703, filed on Feb. 12, 2001.

(51) Int. Cl.
*H04B 10/12* (2006.01)
(52) U.S. Cl. .................................. 359/337.1; 359/349
(58) Field of Classification Search ............ 359/337.1, 359/337.11, 349
See application file for complete search history.

(56) References Cited

U.S. PATENT DOCUMENTS

| | | | |
|---|---|---|---|
| 5,422,968 A | | 6/1995 | Hanatani et al. |
| 5,519,796 A | * | 5/1996 | Li et al. ........................ 385/24 |
| 5,933,270 A | | 8/1999 | Toyohara |
| 6,094,296 A | | 7/2000 | Kosaka |
| 6,104,526 A | | 8/2000 | Kakui |
| 6,151,157 A | | 11/2000 | Ball et al. |
| 6,175,671 B1 | | 1/2001 | Roberts |
| 6,215,581 B1 | | 4/2001 | Yadlowsky |
| 6,236,487 B1 | | 5/2001 | Stephens |
| 6,359,730 B1 | * | 3/2002 | Tervonen ..................... 359/349 |
| 6,452,718 B1 | * | 9/2002 | Augustsson .............. 359/337.1 |
| 6,549,688 B1 | * | 4/2003 | Bazylenko ................... 385/14 |

* cited by examiner

*Primary Examiner*—Mark Hellner
(74) *Attorney, Agent, or Firm*—Freedman & Associates

(57) ABSTRACT

A dynamic gain equalizer using amplification instead of attenuation is disclosed. The device relies on integrated semiconductor optical amplifiers in line with a demultiplexer on a single integrated substrate for performing equalization of signals within each of a plurality of channels.

58 Claims, 8 Drawing Sheets

OPTICAL DYNAMIC GAIN AMPLIFIER

This application claims the benefit of U.S. Provisional Patent Application 60/267,703 filed Feb. 12, 2001.

FIELD OF THE INVENTION

The invention relates generally to semiconductor optical waveguides and more particularly to a dynamic gain equalizer using amplification to equalize gain.

BACKGROUND OF THE INVENTION

Fibre optic communication systems have gained widespread acceptance over the past few decades. With the advent of optical fibre, communication signals are transmitted as light propagating along a fibre supporting total internal reflection of the light propagating therein. Many communication systems rely on optical communications because they are less susceptible to noise induced by external sources and are capable of supporting very high-speed carrier signals and increased bandwidth. Unfortunately, optical fibre components are bulky and often require hand assembly resulting in low yields and high costs. One modern approach to automated manufacturing in the field of communications is integration. Integrated electronic circuits (ICs) are well known and their widespread use in every field is a clear indication of their cost effectiveness and robustness. A similar approach to optical communication components could prove helpful.

Unfortunately, integrated optical devices are generally quite lossy resulting in what is often unacceptable performance. In order to compensate for the performance of a lossy device, one approach is to use external optical amplifiers to amplify the light provided to the lossy component. Unfortunately, because of non-linearities in the optical amplification gain profile and in optical losses of an integrated component, results vary when changing either of these two devices in an optical system and generally, this approach is not preferable.

For example, a typical erbium doped fibre EDF produces differing gains for different wavelength channels when it is pumped. Using this technology in a fibre amplifier requires some means of ensuring that the different wavelength channels each receive the same amount of optical amplification. To compensate for the differing gains, a gain flattening filter is introduced to the amplifier assembly. The response of this filter assists in flattening amplification of the EDF. Unfortunately, the filter and the EDF are never perfectly matched. Consequently, the problem is not eliminated but merely reduced. Additionally, the gain flattening filter is a passive device with optical attenuation. Consequently, all the optical signals will loose some optical intensity when this component is used.

Of course, all of the above does not even begin to address manufacturing variations and tolerances wherein a filter response is within a range of acceptable filter responses and not at the exact, design specified, response. Thus, with an EDFA that varies from the design specified amplification response and a filter that similarly varies, the result is often the sum of the two variations.

It would be advantageous to produce an integrated device with minimal or no loss. Additionally, it would be advantageous to produce an integrated device providing dynamic gain equalization through amplification. Such a dynamic gain equalizer will act to replace a conventional dynamic gain equalizer combined with an amplifier providing a smaller and less expensive optical component.

OBJECT OF THE INVENTION

It is an object of the invention to provide an integrated dynamic gain adjuster capable of functioning with minimal or no loss.

SUMMARY OF THE INVENTION

According to the invention there is provided a gain equaliser comprising: an input port for receiving an optical signal; a demultiplexer for demultiplexing the received optical signal into separate optical signals corresponding to predetermined wavelength channels; and, a plurality of optical amplifiers for amplifying each of the separate optical signals, wherein the gain equaliser is integrated on a same substrate.

In another embodiment the invention provides a method of variably amplifying an optical signal corresponding to specific wavelength channels within a wavelength multiplexed optical signal comprising: receiving the wavelength multiplexed optical signal at a first port of an integrated substrate; separating the wavelength multiplexed optical signal into optical signals corresponding to at least a specific wavelength channel; and, amplifying each optical signal corresponding to the specific wavelength channel separately and independently.

Additionally the invention describes an optical component in the form of a gain equaliser comprising: an input port for receiving an optical signal; an output port; a demultiplexer for demultiplexing the received optical signal into separate optical signals corresponding to predetermined wavelength channels; and, a low frequency response optical gain adjustment component for receiving at least a separate optical signal from the separate optical signals and for affecting an intensity thereof with a low frequency response; and, a high frequency response optical gain adjustment component in series with the low frequency optical gain adjustment component for receiving the at least a separate optical signal from the separate optical signals for affecting an intensity thereof with a high frequency response.

The invention also describes a method of variably amplifying an optical signal comprising the steps of: monitoring the optical signal; providing a high frequency control signal to a first optical gain equalization element for varying an intensity of the monitored optical signal the variations having high frequency; and, providing a low frequency control signal to a second optical gain equalization element for varying the intensity of the monitored optical signal the variations having low frequency.

BRIEF DESCRIPTION OF THE DRAWINGS

Exemplary embodiments of the invention, will now be described, in conjunction with the drawings, in which.

DETAILED DESCRIPTION OF THE INVENTION

Figure 1:
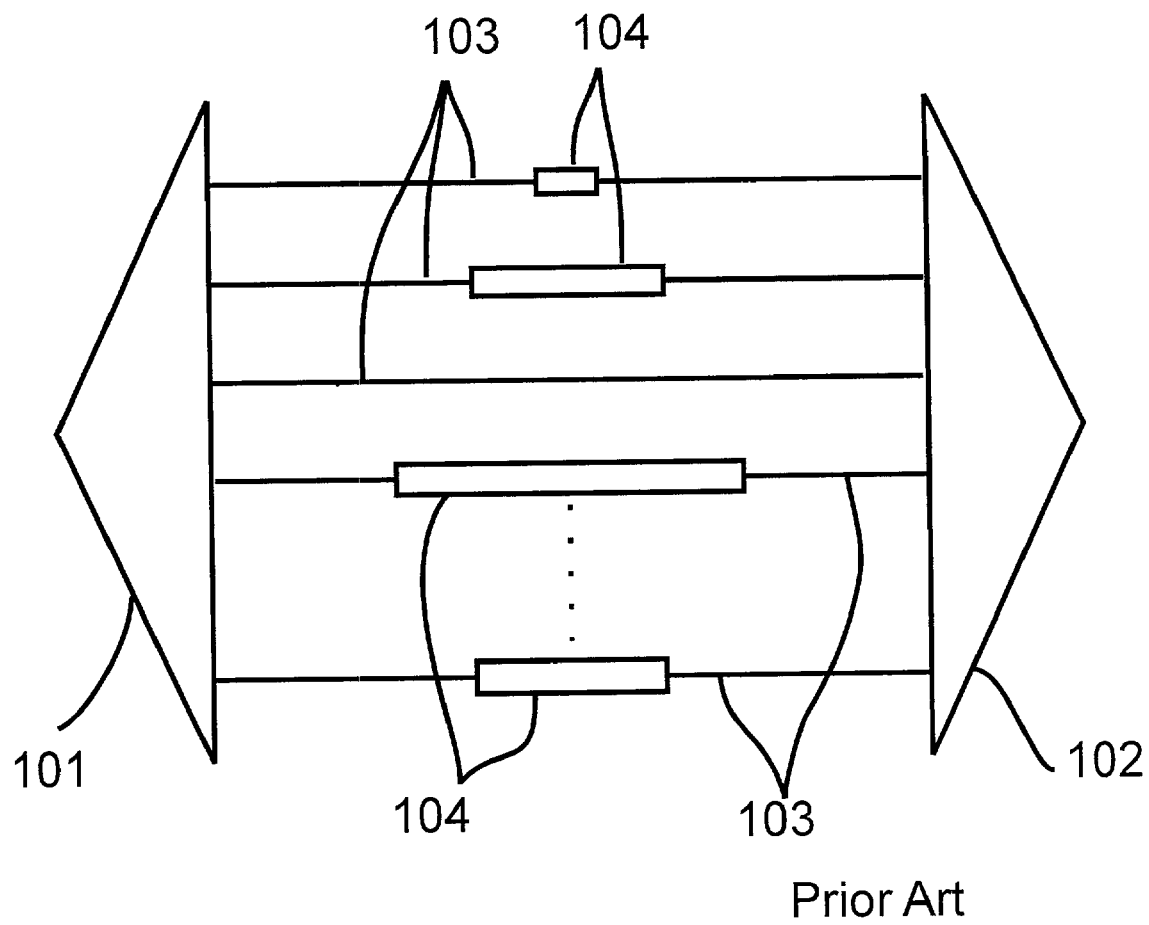
FIG. 1 is a schematic diagram of a prior art gain flattening filter featuring a set of fixed attenuators disposed between a wavelength demultiplexer and a multiplexer.

In U.S. Pat. No. 5,519,796, filed 6 Mar. 1995, Li and Tong disclose their design for an optical device for gain equalization. Referring to FIG. 1, this device acts as a gain flattening filter whose attenuation for each wavelength channel is determined by the length of one of a set of metallic strips 104 on the waveguides 103 corresponding to that wavelength channel. The ability to attenuate each wavelength channel separately is a significant advancement over a conventional gain flattening filter. Additionally, this component is well suited to mass production. Unfortunately, the attenuation of optical signals within each wavelength channel is determined by the length of the individual metallic strips and the attenuation characteristics of the multiplexing demultiplexing elements 101 and 102. Therefore the response of the device is fixed when it is built. Clearly, if the device is designed and built in production quantities, variations due to manufacturing tolerances will affect it. It also appears nearly impossible to calibrate such a device during manufacture.

Figure 2:
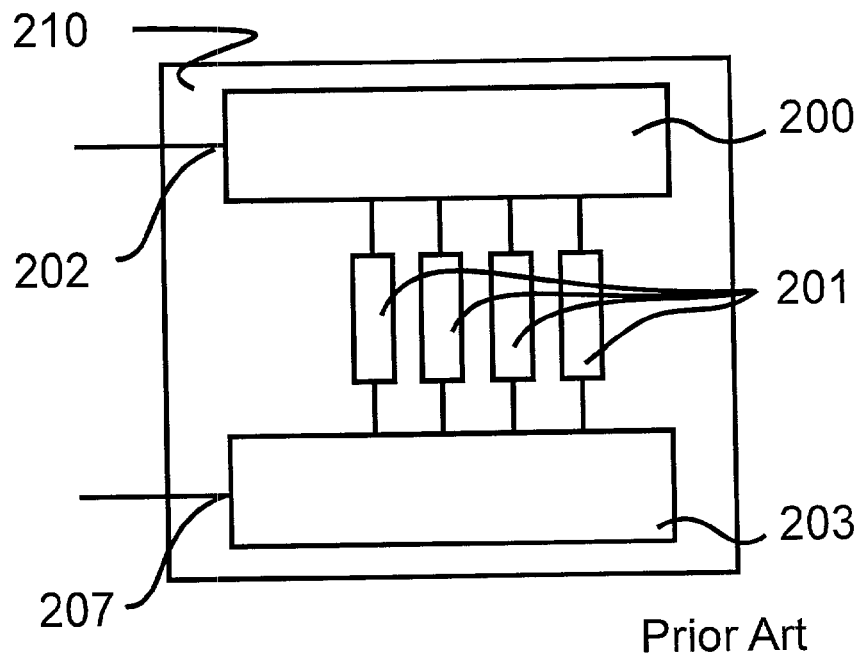
FIG. 2 is a prior art schematic diagram of a dynamic gain equaliser with variable attenuators disposed between a demultiplexer and a multiplexer.

As disclosed in U.S. Pat. No. 6,236,487, filed 21 Jul. 1998, by Stephens, it is known that optical amplifiers should be combined with variable attenuators for each wavelength channel of a system in order to function adequately and consistently in modem optical communications networks. Referring to prior art FIG. 2, the gain equalizer 210 was developed to provide the performance of the gain flattening filter with the ability to adjust the attenuation of the individual wavelength channels as required. The device consists of a demultiplexer 200, a plurality of variable optical attenuators 201 and a multiplexer 203. The demultiplexer 200 receives a wavelength multiplexed optical signal at the input port 202. The wavelength multiplexed optical signal is separated into a set optical signals associated with a set of predetermined wavelength channels. The optical signal associated with a given wavelength channel is provided to a specific variable optical attenuator 201 such that every optical signal is attenuated by a different attenuator. Each attenuator 201 reduces the power of the optical signal to the appropriate level and provides the attenuated signal to the multiplexer 202. The multiplexer combines the optical signals from the predetermined wavelength channels and provides the multiplexed optical signal at the output port 207 of the multiplexer 203. The amount of attenuation associated with each wavelength channel is variable and typically the attenuation is controlled externally. This variable attenuation allows the gain equalizer to work with any optical amplifier in a variety of different conditions.

Figure 3:
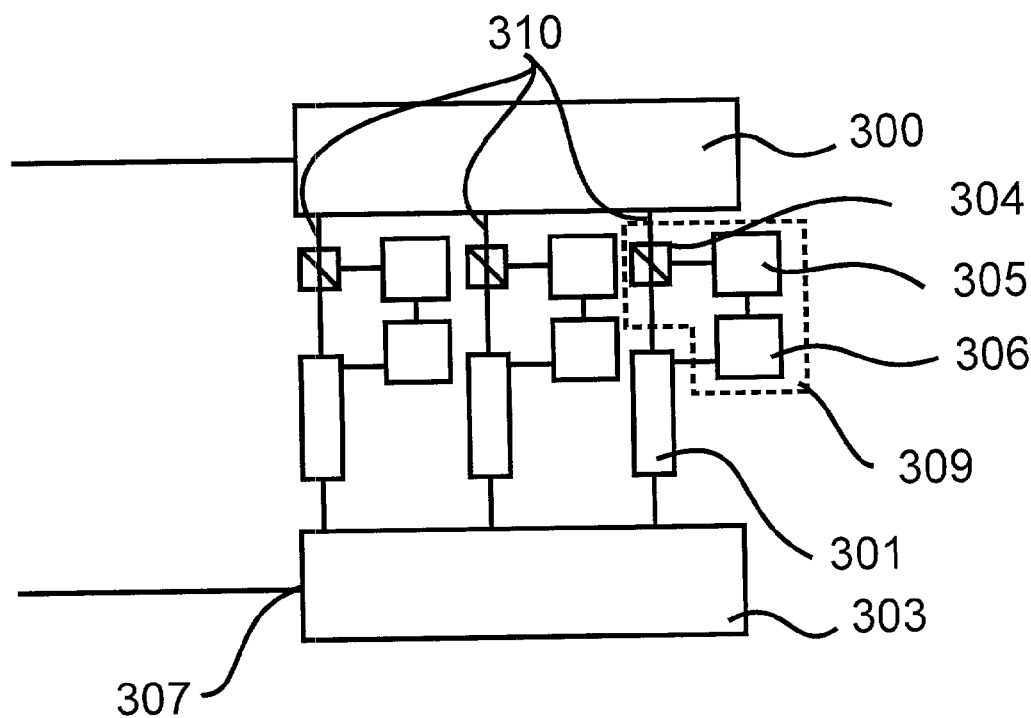
FIG. 3 is a prior art schematic of a gain equalizer featuring taps for monitoring the intensity of each signal and a controller for varying the attenuation provided by each variable attenuator.

Referring to prior art FIG. 3, a gain equalizer 310 is further improved by the addition of a signal monitor for every channel. An optical signal is provided to a wavelength division multiplexer 300. The signal is divided into a plurality of different optical signals, each corresponding to a characteristic wavelength channel. Each of these optical signals is provided to a different output port of the wavelength division multiplexer 300. Each of these output ports is coupled to an optical waveguide 310 that allows the optical signal to propagate to a signal monitor 309. Each signal monitor consists of an optical tap 304, which redirects a small fraction of the power of the optical signal allowing the remainder of the signal to propagate to the variable optical attenuator 301, an optical signal receiver 305, and a control system 306. The receiver 305 creates an output signal based upon the intensity of the optical signal that it receives. The power signal provided by the receiver 305 is provided to a control system 306. The control system 306 provides data that is used by the variable attenuator 301 for adjusting the level of attenuation. Since each wavelength channel is supported by a separate waveguide, every waveguide requires a separate signal monitor. The optical signals are then provided from the attenuators to a wavelength division multiplexer 303 where they are multiplexed and provided an output port 307 of the wavelength division multiplexer 303. This device facilitates the active attenuation of each optical signal within a given wavelength channel in a system.

This device works to attenuate optical signals within predetermined wavelength channels. Typically, this device is combined with an optical amplifier and this combination of devices provides optical amplification with a predetermined, usually flat, wavelength profile. Unfortunately, it requires many expensive components to build and although it works adequately, the components it uses will attenuate optical signals propagating therein. Thus, a portion of the gain provided by the amplifier is effectively eliminated by this device.

Figure 4:
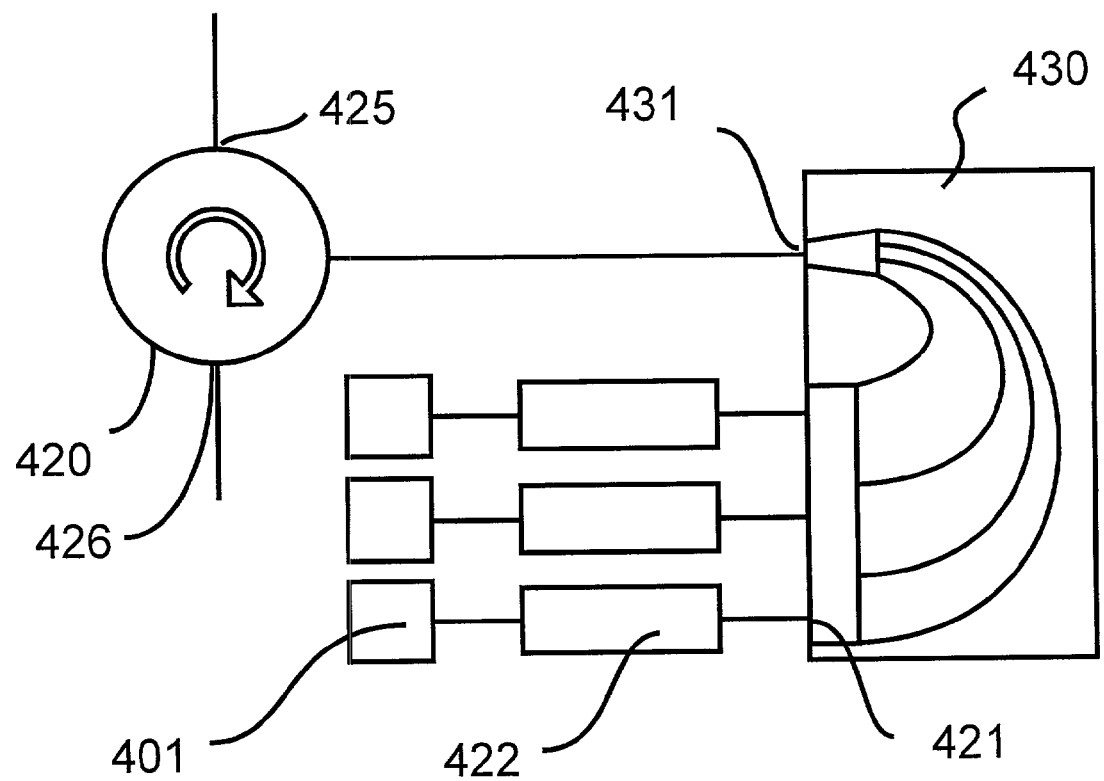
FIG. 4 is a schematic diagram of a prior art optical equalizer featuring a circulator, a single wavelength dispersive element, a set of variable attenuators and a set of reflectors.

Referring to prior art FIG. 4, a superior gain equalizer is demonstrated. In U.S. Pat. No. 5,933,270, filed 8 Dec. 1997, Toyohara discloses a design of an optical assembly for variably attenuating a plurality of optical signals whose wavelengths are within different wavelength channels. Similarly to the gain equalizer described in FIG. 2, in function, this device receives a wavelength multiplexed optical signal, demultiplexes it, separately attenuates optical signals corresponding to specific wavelength channels and finally, multiplexes the optical signals and provides them at an output port. A circulator 420 receives an optical signal at a first port 425. The circulator 420 directs the optical signal to the input port 431 of a bi-directional wavelength demultiplexer 430. Each output of the wavelength demultiplexer is attached to a variable attenuator and a reflector. An optical signal having a wavelength corresponding to a specific wavelength channel is provided by the wavelength division demultiplexer 430 at an output port 421. The optical signal propagates to a variable attenuator 422 and then to a reflector 401. The reflector 401 causes the demultiplexed optical signal to propagate through the variable attenuator 422 again and consequently, the signal is affected by the attenuator twice. The demultiplexed optical signals, each having been separately attenuated are coupled to the wavelength demultiplexer 430 where they are multiplexed. The attenuated multiplexed signal is then provided back to the circulator 420.

Toyohara does not suggest using this architecture with amplifiers on each channel. A person of skill in the art of optical component design will be aware that optical amplifiers typically used in optical networks are very expensive and consequently it would be prohibitively expensive to attach an EDFA to every supported optical channel.

In U.S. Pat. No. 6,175,671, filed 1 Oct. 1998, Roberts discusses the use of photonic crystal waveguide arrays. One of the devices proposed by Roberts is an optical equalizer with a wavelength demultiplexer, multiplexer and series of interferometers for variably attenuating optical signals. This device is intended to function as a dynamic gain equalizer and it appears to take advantage of integrated optics to produce the device on a single substrate. Roberts suggests using external applied control to vary the dielectric properties of a predetermined region. This disclosure focuses on the design of an integrated gain equalizer. While it does describe the components required to provide proper feedback to the equalizer it specifically uses a dielectric substrate. Since dielectrics are electrical insulators it strongly suggests that the author does not intend to integrate the optical detectors and electronic components required to operate a gain equalizer on the substrate. Indeed, Roberts demonstrates many embodiment which all feature external optical detectors and control circuitry. The use of external discrete optical components results in an expensive assembly due the time, effort and need for external components.

Roberts demonstrates the potential for photonic crystal waveguide arrays however this technology is unproven at this time. The design proposed is functional, but certain to be costly as a result of optically coupling various components.

In U.S. Pat. No. 5,528,710, filed as PCT 5 May 1993, Burton describes a substrate with an optically passive region and an optically active region. The device Burton describes is a matrix switch with broadcasting capability. The device depends on the integrated optical amplifiers to ensure that received optical signals provided to the substrate are adjusted to have roughly equal power to other signals that are received by the substrate. Switching action is achieved by using the amplifying region of the optical amplifier as an attenuator. The attenuation caused by the signal traversing an optical amplifier with no power, the loss associated with splitting the signal, and the loss associated with propagation through the substrate effectively ensure that the optical signals are not present at the output ports where they are not desired.

This device clearly suggests the potential that integrated optical components have. Clearly, this device is an optical switch. It is not proposed as a gain equalizer and it does not support wavelength division multiplexing.

The optical gain equalizer is an optical component that is usually associated with a separate optical amplifier. Optical amplification allows optical network designers to design optical networks with very long distances between the provider of the optical signal and the receiver of the optical signal. The technology associated with these devices is complex but the problem that they are meant to solve is simple. One problem apparent in optical networks is undesired optical attenuation from optical fibres and optical components along the propagation path of the optical signal. When too much attenuation is experienced within the network, the optical signals are very difficult to read at the receiver. Typically, the optical receivers are designed to read an optical signal whose output is within a predetermined range of intensity. If the optical intensity is too great then the signal may saturate the receiver causing it to perceive a signal that is distorted. Alternatively, if the signal power drops too low, which is the case when too much attenuation is present, then the signal may not be detectable by the receiver or alternatively, the signal to noise ratio of the signal will be sufficiently poor that it becomes a very difficult task to separate the optical signal detected from the detected noise. Consequently, the designers of optical networks must determine what components and what distances their networks span based upon a variety of concerns, the main one being a loss budget. In metropolitan network applications (often referred to as "Metro" or "Metro access") the network itself is concentrated in a comparatively small area. Consequently, the attenuation within the fibre is less critical compared to the attenuation within the components. Optical networks designed for this purpose would benefit tremendously from inexpensive, integrated components whose loss is internally compensated for.

Figure 5:
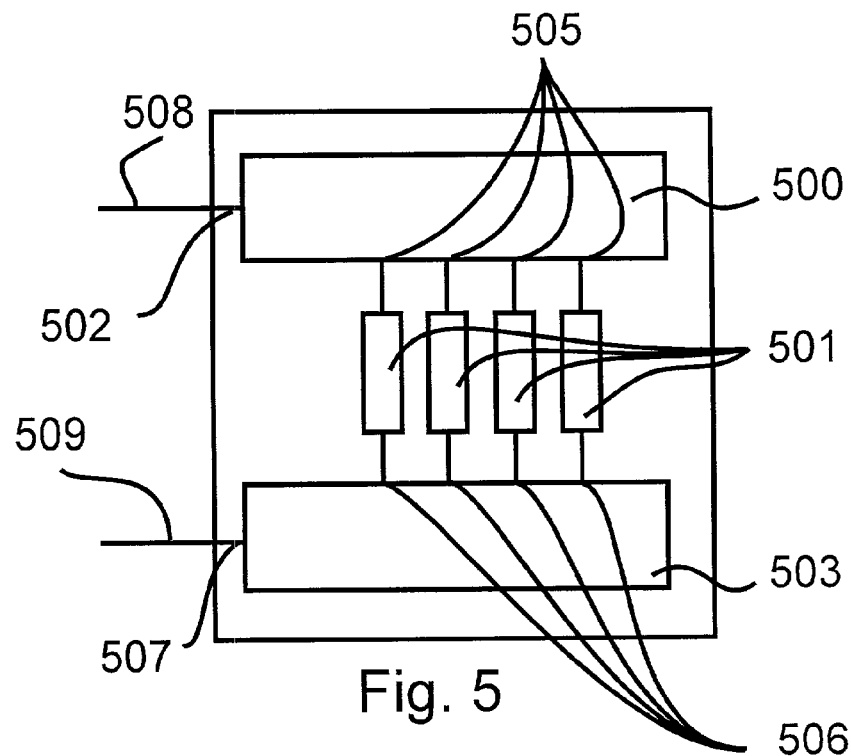
FIG. 5 is a schematic diagram of a dynamic gain equaliser with variable amplifiers disposed within a bidirectional demultiplexer/multiplexer path according to the invention.
Figure 6:
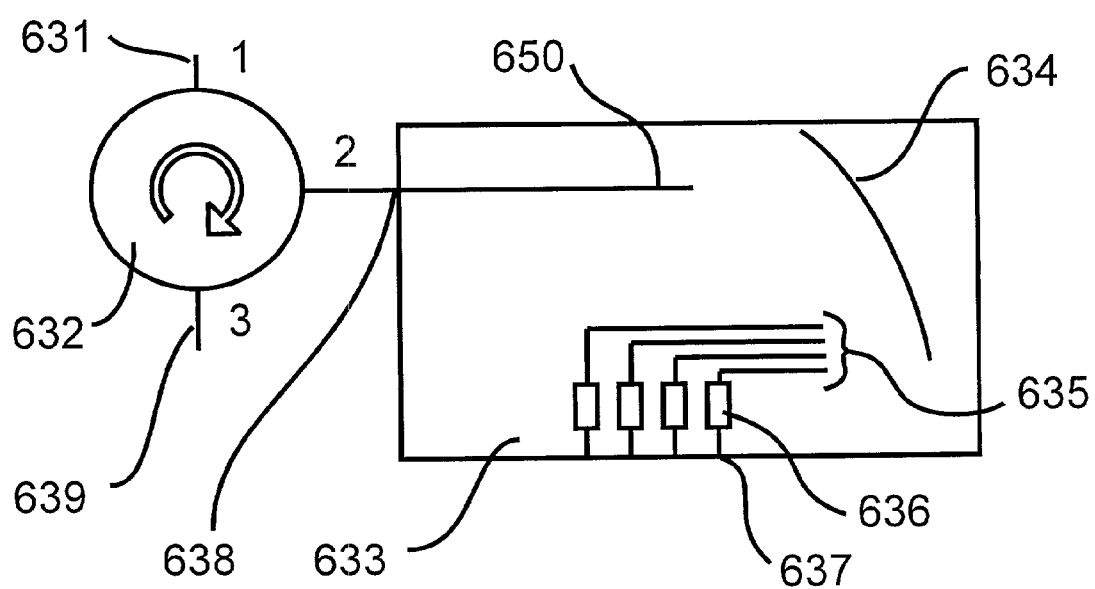
FIG. 6 is a schematic diagram of a dynamic gain equaliser with variable amplifiers disposed within a looped back demultiplexer/multiplexer path using a single grating for both demultiplexing and multiplexing functions and an optically coupled circulator.

Referring to FIG. 5, a schematic diagram of an embodiment of the invention in the form of an integrated dynamic gain amplifier is shown. A wavelength multiplexed optical signal is received at an input port 502 of a demultiplexing element 500 via an optical fibre 508. The demultiplexing element 500 separates the wavelength multiplexed optical signal into several optical signals in dependence upon their wavelength and provides them at output ports 505. Each of the optical signals propagates through one of the optical amplifiers 501. The amplifiers 501 amplify the optical signals to an approximately equal intensity level. From the amplifiers 501, the signals are provided to input ports 506 of a multiplexer 503 where they are multiplexed into a single output signal provided to output port 507, which is coupled to a fibre 509. Since the components are integrated on a same substrate the overall cost is significantly reduced. Advantageously, in the embodiment of FIG. 5, any noise that is introduced into the optical signals during amplification that does not correspond to the wavelength channel of the optical signal being amplified will be substantially attenuated when the optical signals are wavelength multiplexed. Since the various components are present on the same substrate the communications paths are provided when the integrated component is produced. In order to produce an equivalent prior art component it would be necessary to optically couple the amplifiers to a separate multiplexer. This increases the cost of manufacturing and introduces an opportunity to damage the separate components prior to assembly. Referring to FIG. 6, a simplified schematic diagram of a gain equalizer according to the invention is shown. An input fibre 631 is coupled to circulator 632. Circulator 632 provides signals received at port 1 to port 2 and signals received at port 2 to port 3. Optical signals propagating within the fibre 631 pass through circulator 632 to a demultiplexer 633. The demultiplexer is in the form of an integrated waveguide device including a grating 634 for directing light incident thereon toward a number of waveguides 635 in dependence upon wavelength. Each of the waveguides is optically coupled to an optical amplifier 636 in the form of a semiconductor optical amplifier formed integrally within the waveguide structure. After amplification by the semiconductor optical amplifiers, the signals reflect off mirror surface 637 and propagate in a reverse direction propagating again through the optical amplifier and being wavelength multiplexed by the grating 634. The multiplexed and gain amplified optical signal propagates along waveguide 650 to the port 638. From the port 638 the light propagates to the circulator 632 and out the output port thereof to an output fibre 639. Of course, though the mirrored surface is shown at an endface of the integrated optical device, this need not be the case.

It is advantageous that each optical amplifier is traversed twice by light propagating within the device, since the amount of amplification is dependant upon the length of the optical path through the amplifying region of the amplifier. Since the optical signals propagate through the amplifier twice the effective length of the amplifier is doubled or alternatively stated, the actual length of the amplifier can be approximately halved. Also, since the reverse optical path is used, the resulting combined signals suffer a minimum of degradation associated with imperfections in the multiplexer/demultiplexer. When the optical signals are demultiplexed by the grating some light is lost due to imperfections in the grating. Assuming that the light signal is not amplified or attenuated but merely reflected back upon the grating the signals will experience minimal losses associated with those aforementioned imperfections in the grating.

Additionally, this device is optionally calibrated to ensure that any wavelength dependant loss associated with the grating is compensated for by adjusting the overall gains of the amplifiers on the integrated substrate. This calibration is optionally performed after manufacture, though it may include portions that are performed during design. For example, the grating shown in FIG. 6 results in losses for channels that are near the edge more than channels at a center of the grating's frequency response. Thus, amplifiers for those more attenuated channels are optionally designed to approximately compensate for this additional loss merely based on design variations. Optionally, the device is calibrated to compensate for the loss associated with other external component as well. This embodiment is said to be optically directional—it receives an optical signal at the first port of the circulator, applies a transformation to the optical signal and provides the resultant optical signal to the third port of the circulator. However, in the event that an optical signal is provided at the third port of the circulator, it propagates directly to the first port of the circulator absent the step of transformation.

Figure 7:
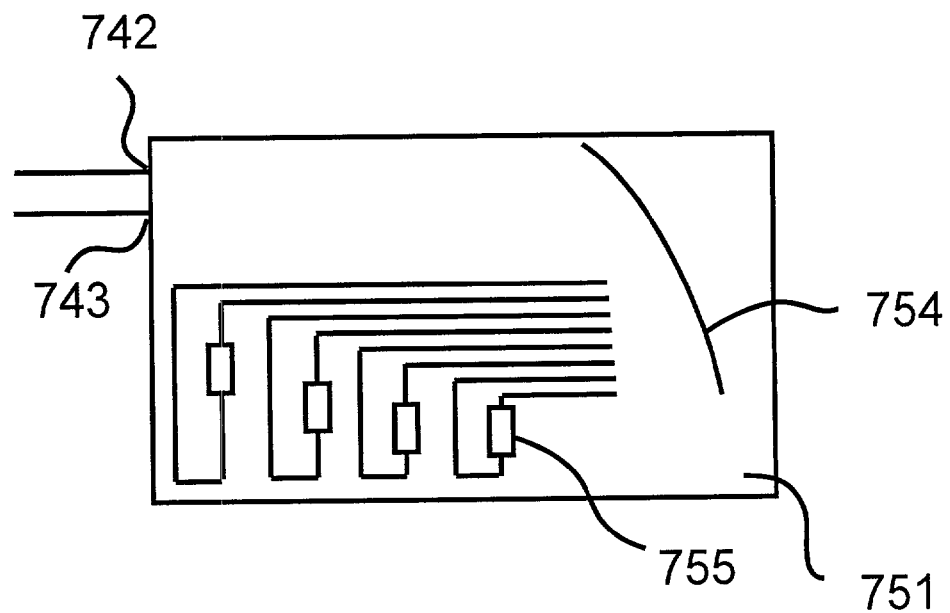
FIG. 7 is a schematic diagram of a dynamic gain equaliser with variable amplifiers disposed within a looped back demultiplexer/multiplexer path using a single grating for both demultiplexing and multiplexing functions.

Referring to FIG. 7, another embodiment of the invention is shown wherein a multiplexer/demultiplexer device 751 is provided with an optical input port 742 and an optical output port 743 in order to obviate a need for a circulator. The device 751 includes a grating 754 for directing the light incident thereon in dependence upon wavelength along different optical paths. Along each path is an optical amplifier 755 in the form of a semiconductor optical amplifier. Because the output ports and the input ports of the MUX/DEMUX are adjacent one another a set of return waveguides is provided internal to the integrated device to direct each wavelength channel signal back toward the grating 754. The optical amplifiers provide variable amplification in dependence upon feedback signals from external monitoring elements to the device. By eliminating the need for a circulator, this embodiment avoids the introduction of any unwanted optical characteristics associated with a circulator such as crosstalk and insertion loss. Additionally, since no circulator is used, the cost of the circulator is avoided and packaging of the finished product is simpler and more compact. One skilled in the art of optical module design will realize that although optical circulators are quite small, one small optical component within an optical module allows the designer to make the finished module quite small. When a module includes two small optical components connected by an optical fibre it is accepted practice to wrap the fibre in a loop and fit the components in a package whose size will accommodate the loop of fibre. Again, one skilled in the art of optical module design will be aware that the optical characteristics of optical fibre are dependant upon mechanical stress. If the fibre is wrapped in a loop with a radius that is smaller than the characteristic minimum bend radius of the fibre then it will likely result in some attenuation as well as polarization dependant loss. Although different fibres have different minimum bend radii, a bend radius of approximately 2.5 cm or 1 inch is typical. With only one component in the module, the need for a loop of fibre is eliminated and therefore the dynamic gain amplifier module according to this embodiment is quite small.

Figure 8:
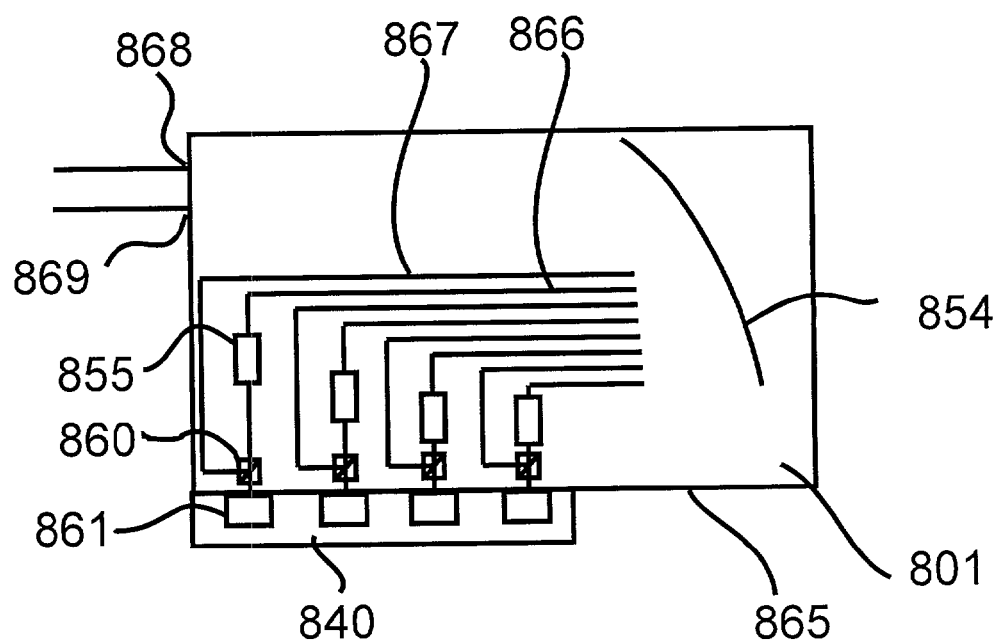
FIG. 8 is a schematic diagram of a dynamic gain equaliser with variable amplifiers disposed within a bidirectional demultiplexer/multiplexer path and showing external monitoring elements for controlling the amplification within each of the bidirectional paths.

Referring to FIG. 8, an embodiment of the invention is shown. This embodiment features an integrated optical substrate 801 with a grating 854 and integrated amplifiers 855. The substrate 801 receives a wavelength multiplexed optical signal at a first port 868. The optical signals propagate to the grating 854 where they are demultiplexed in dependence upon wavelength along different optical paths. The optical paths each include an amplifier 855 and a tap 860. An optical signal propagating along waveguide 866 is optionally amplified as it propagates through the amplifier 855. The signal is then tapped resulting in a small percentage of the optical signal proceeding to the optical monitor 861. The remainder of the optical signal propagates through waveguide 867 to the grating and then to the output port 869. The optical monitor 861 is on a second optical substrate 840. In this embodiment, the edge of the integrated optical substrate 865 has been cleaved at a slight angle to reduce the likelihood of any light going from the tap to the monitor of reflecting of the surface 865 and thereby returning to the tap.

In this embodiment, the optical monitors are sufficiently large to ensure good optical coupling of the tapped signal and easy alignment of the second substrate with respect to the integrated optical substrate without allowing optical crosstalk between the tapped signal and any other tapped optical signals. Clearly, the second substrate has been designed to ensure that the pitch of the optical monitors is approximately equal to the pitch of the tapped signals provided by the integrated optical substrate. This embodiment provides a simple, inexpensive and compact apparatus that not only gain amplifies the optical signal but monitors the output signals as well. Additionally, this device is easily calibrated to ensure that the wavelength multiplexed output optical signal has been properly equalized. In order to ensure that feedback signals from the optical monitors are accurate, the coupling between the optical monitors and the integrated optical substrate are preferably consistent. Advantageously, if the device is calibrated then coupling may be quite lossy without compromising the accuracy of the feedback signal provided by the monitors.

Figure 9:
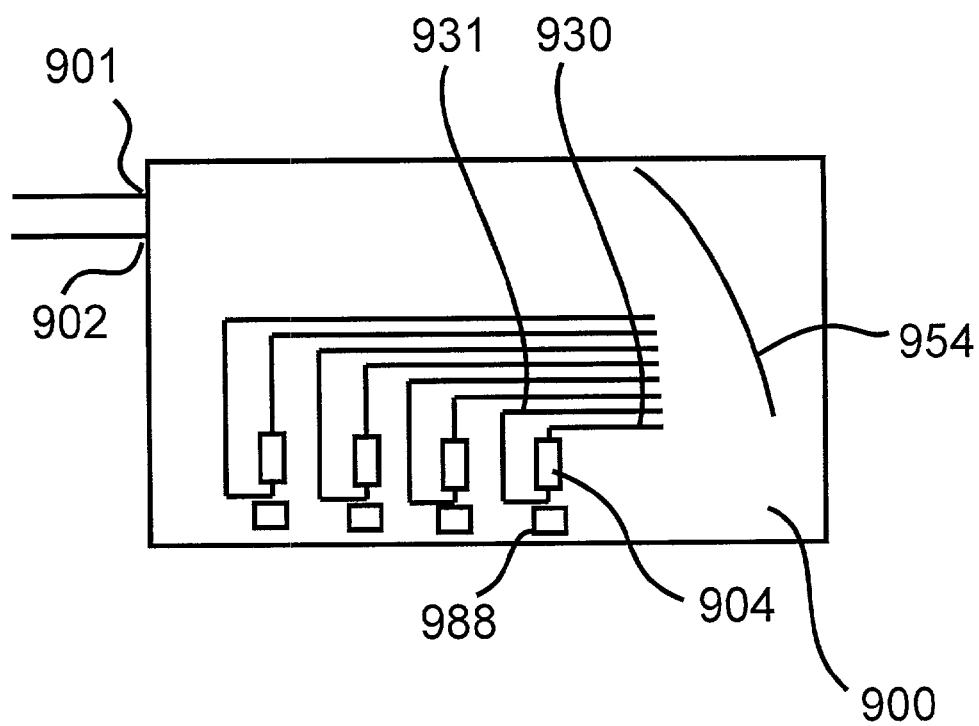
FIG. 9 is a schematic diagram of a dynamic gain equaliser with integrated variable amplifiers disposed within a looped back demultiplexer/multiplexer path using a single grating for both demultiplexing and multiplexing functions and wherein monitoring elements are also integral to the waveguide device.

Referring to FIG. 9 another embodiment of the invention is shown with integral monitoring devices included therein. The integrated optical substrate 900 includes an input port 901, an output port 902, a grating 954, optical amplifiers 904 and monitoring elements 988 for sensing light. The monitoring elements provide a signal to a controller (not shown) for determining an appropriate level of amplification for each of the optical amplifiers 904. An optical signal is coupled to the input port 901. This optical signal is wavelength division demultiplexed by the grating 954 and optical signals corresponding to predetermined wavelength channels are provided to other waveguides on the integrated optical substrate. One such optical signal propagates along a waveguide 930. It is optionally amplified as it propagates through an optical amplifier 904. The signal is then split with a small fraction of the signal being sent to an optical monitor 988. The remainder of the optical signal propagates along waveguide 931. It is then provided to the grating 954 and then provided to the output port 902. A variety of separate optical paths each corresponding to one of the predetermined wavelength channels is provided. Each path includes an amplifier for varying the intensity of the optical signal and a monitor for providing feedback data regarding the intensity of the optical signal provided from the amplifier. In contrast to the embodiment of FIG. 8, by combining the monitoring elements on the same substrate as the amplifiers, the device is further simplified. This simplification results in a dynamic gain amplifier with only two optical couplings. This simplifies production even further, without increasing costs or compromising reliability.

Figure 10:
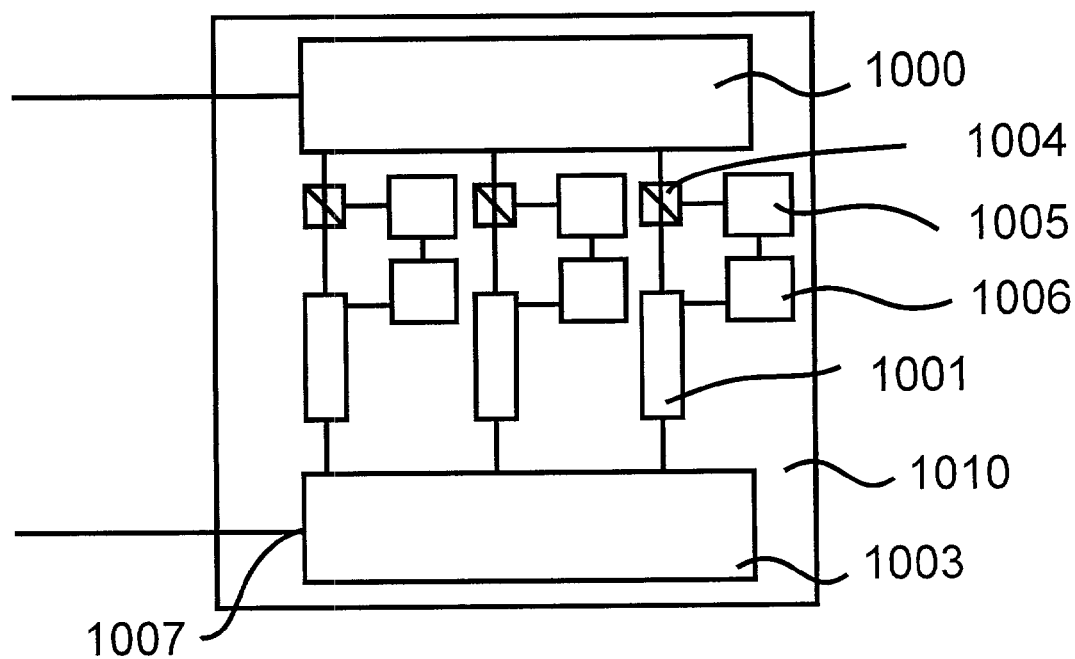
FIG. 10 is a simplified schematic diagram of a dynamic gain equalizer with a wavelength division demultiplexer, optical monitors, optical amplifiers and a wavelength division multiplexer integrated on a same substrate.

Referring to FIG. 10, an embodiment of the invention is shown with separate optical amplifiers, optical monitors, a multiplexing element and a demultiplexing element on a same integrated substrate 1010. An optical signal is provided to a wavelength division multiplexer 1000. The signal is divided into a plurality of different optical signals, each corresponding to a characteristic wavelength channel. Each of these optical signals is provided to a different output port of the wavelength division multiplexer 1000. Each these output ports is coupled to an optical waveguide that allows the optical signal to propagate to a signal monitor. Each signal monitor consists of an optical tap 1004, which redirects a small fraction of the power of the optical signal allowing the remainder of the signal to propagate to the variable optical amplifier 1001, and an optical signal receiver 1005. The receiver 1005 creates an output signal based upon the intensity of the optical signal that it receives. The power signal provided by the receiver 1005 is provided to a control system data port 1006. The control system data port 1006 provides data that is used by the amplifier 1001 for adjusting the level of amplification. Since each wavelength channel is supported by a separate waveguide, every waveguide requires a separate signal monitor. The optical signals are then provided from the amplifiers to a wavelength division multiplexer 1003 where they are multiplexed and provided an output port 1007 of the wavelength division multiplexer 1003. In this embodiment, the optical signals are tapped and monitored prior to amplification. The choice of tapping before or after amplification is left the designer skilled in the art of optical component design. In this embodiment, the optical gratings are preferably produced with great care to ensure that they are very well matched.

Figure 11:
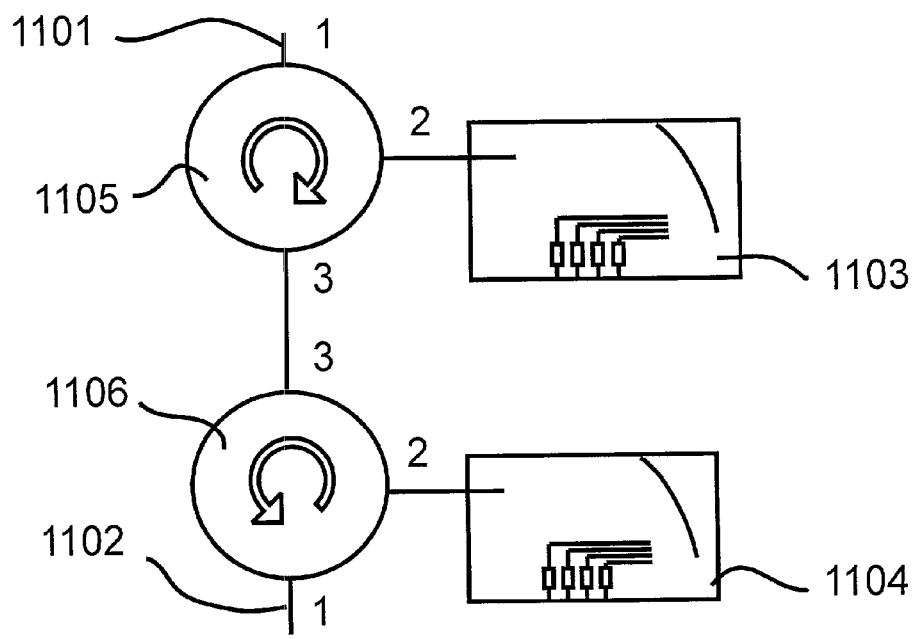
FIG. 11 is a simplified schematic diagram of a pair of dynamic gain amplifiers optically coupled to circulators to provide fully bi-directional operation.

Referring to FIG. 11, a of pair devices according to the embodiment of FIG. 6 are arranged to provide bidirectional operation for the device such that the wavelength division multiplexed optical signals are provided by either of connection fibres 1101 and 1102. The optical circulator 1105 and integrated optical substrate 1103 are combined to produce an assembly described by FIG. 6. Similarly, the optical circulator 1106 and the integrated optical substrate 1104 are combined to produce an assembly also described by FIG. 6. In this way, optical signals propagating from fibre 1101 to 1102 are transformed by the integrated optical substrate 1103, while optical signals propagating from fibre 1102 to fibre 1101 are transformed by the integrated optical substrate 1104. Clearly one of skill in the art of optical component design will be aware that this embodiment will also be enhanced by the addition of optical monitors, which provided feedback signals to the optical amplifiers.

Figure 12:
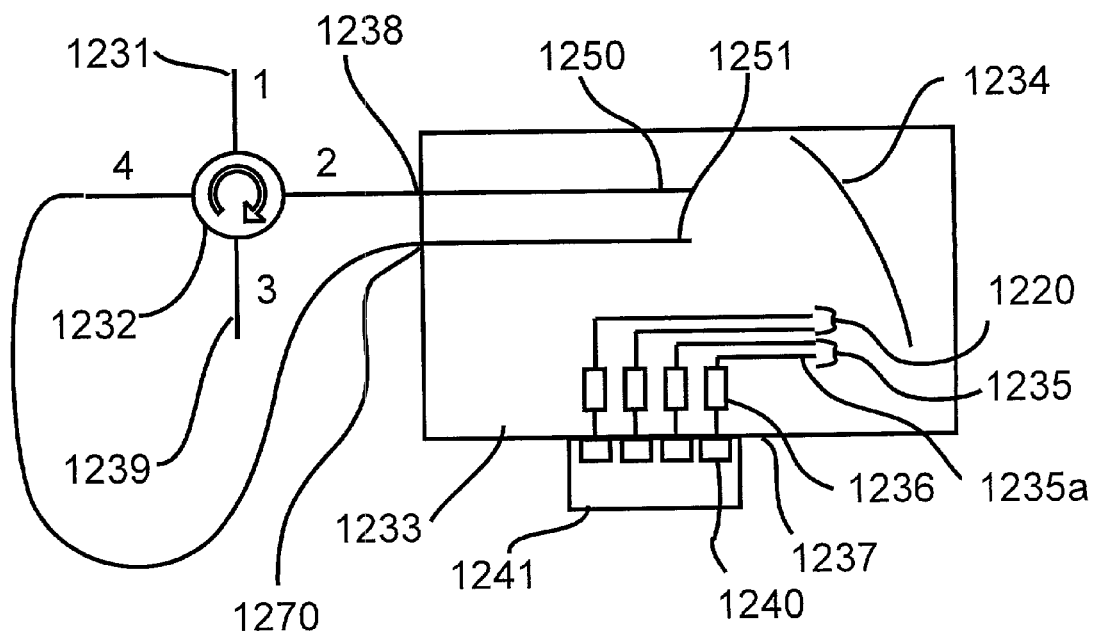
FIG. 12 is a simplified schematic diagram of a bi-directional dynamic gain amplifier featuring a four port circulator and, FIG. 13 is a simplified schematic diagram of a dynamic gain amplifier with amplifiers and attenuators integrated on a same substrate.

Referring to FIG. 12 an embodiment of the invention intended for bi-directional operation is shown. With the exception of the embodiment shown in FIG. 11, the previously shown embodiments of the invention will operate in a bi-directional fashion, however they are not properly suited for this application. Although the optical amplifiers will amplify optical signals in a bi-directional fashion, they do not amplify the optical signals within the same wavelength channel independently based upon the direction of propagation of the optical signal. This embodiment of the invention avoids this particular problem by incorporating a four port circulator 1232. In operation, the four port circulator receives an optical signal at a port and provides that optical signal to the next port. For example, a signal arriving at port 2 goes to port 3 and a signal arriving at port 4 goes to port 1. In this case, a signal provided by an optical waveguide 1231 to port 1 of the circulator 1232 is propagates to port 2 and then to the first port 1238 of integrated waveguide substrate 1233. The signal is wavelength division demultiplexed by the grating 1234 and a first set of optical signals corresponding to predetermined wavelength channels are provided to the waveguides 1235. An optical signal propagating along waveguide 1235a propagates through an optical amplifier 1236. The optical signal continues propagating and partially reflects off the partially reflective surface 1237. A portion of the light that is not reflected is received by an optical monitor 1240. The optical monitor provides data to a control system that controls the degree of amplification provided by the amplifier 1236. The reflected optical signal propagates to the optical amplifier 1236 where it is amplified again. It continues propagating to port 1238. The circulator receives the optical signal at port 2 and provides it to port 3. In this way, the embodiment functions similarly to the embodiment shown in FIG. 6. This embodiment is different in that it has been designed for independent bi-directional operation. Thus, when a second wavelength multiplexed optical signal provided by waveguide 1239 propagates to port 3 of the circulator, the circulator provides it at port 4. The second wavelength multiplexed optical signal will follow an optical path within the integrated optical substrate 1233 beginning at port 1270. Along this path the second wavelength multiplexed optical signal is demultiplexed and provided a second set of optical signals to the waveguides 1220. The optical signals are amplified, partially reflected, monitored, amplified a second time and provided to the grating 1234 in a manner consistent with corresponding operations carried out on the first wavelength multiplexed optical signal and first set of optical signals. The amplified second set of optical signals is then provided to port 1270. From port 1270 the amplified second set of optical signals propagates to the circulator 1232 where it is provided at port 1 and propagates to optical waveguide 1231. Clearly, it is possible to perform the same operations using, for example, the configuration of FIG. 11. However, this embodiment is advantageous for a variety of reasons. It uses only two optical components, one circulator and one integrated optical substrate with a second substrate for the optical monitors and therefore is less expensive. The number of fibre connections between the components is also reduced.

Figure 13:
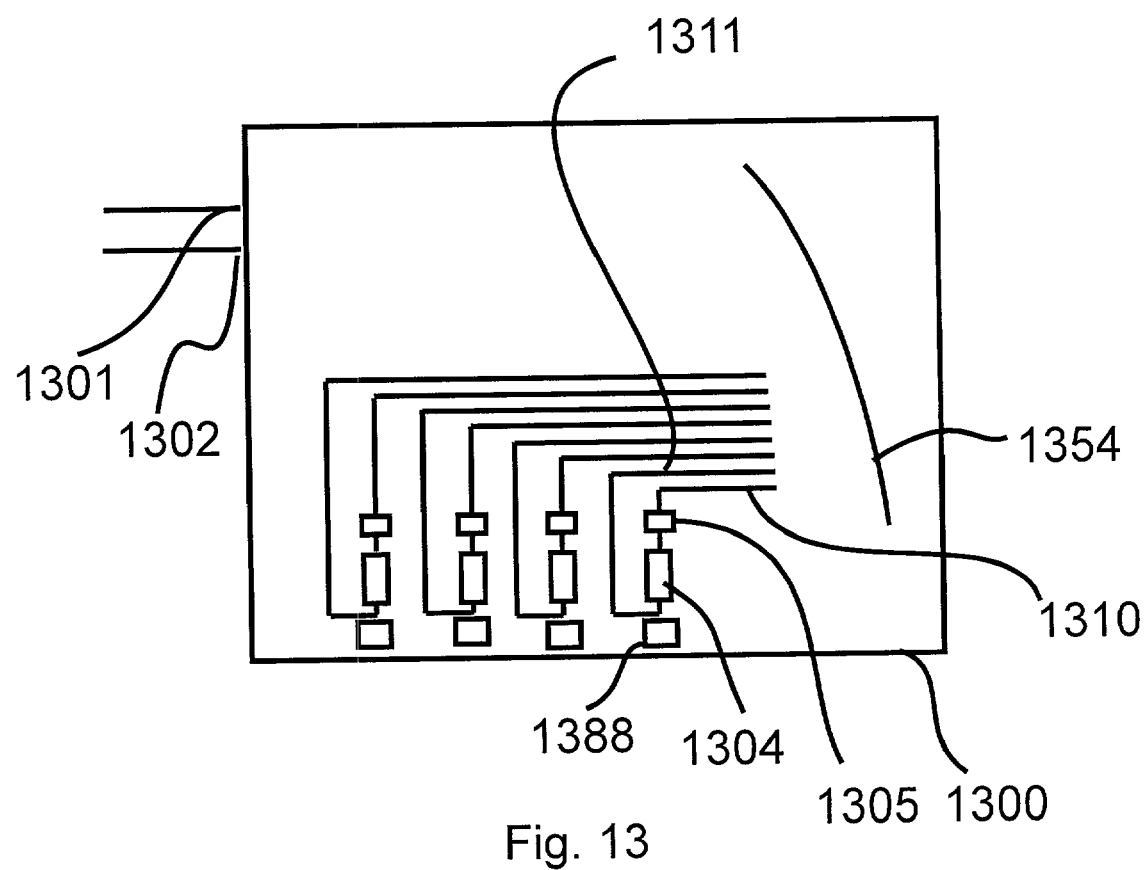

Referring to FIG. 13 an embodiment of the invention is shown that incorporates optical amplifiers and optical attenuators on the same optical paths. This embodiment takes advantage of the high frequency response of the optical attenuators to improve the frequency performance of the device. The high frequency response of the attenuators provides a simple method of rapidly varying the gain provided to an optical signal. The embodiment includes: an input port 1301, an output port 1302, a grating 1354, amplifiers 1305, attenuators 1304 and monitors 1388. In this embodiment, an optical signal is coupled to the input port 1301. This optical signal is wavelength division demultiplexed by the grating 1354 and optical signals corresponding to predetermined wavelength channels are provided to other waveguides on the integrated optical substrate. One such optical signal is coupled to waveguide 1310. The optical signal propagates to an amplifier 1305 and an attenuator 1304. The amplifier 1305 is provided to increase the intensity of the optical signal and the attenuator 1304 is provided to reduce the intensity of the optical signal. The optical signal is then tapped and a fraction of the intensity of the optical signal is provided to the monitor 1388. The monitor provides feedback data to a control system (not shown). The remainder of the optical signal propagates along waveguide 1311. It then propagates to the grating 1354 and is provided at the output port 1302. It is known to those skilled in the art of integrated optical components that the presently available attenuators have higher frequency response for changes in attenuation amount than typical amplifiers. Therefore, two modes of operation are suggested for use with this embodiment of the invention.

In a first mode of operation in which high frequency response is not desired, the control system (not shown) adjusts the control signals to the attenuators to minimize the attenuation they provide. When a change in signal intensity is desired and a low frequency response in performing the change is sufficient, the gains of the amplifiers are adjusted by the control system. Since the amplifiers are powered to a minimum level and the attenuators are not powered, the total amount of power consumed by the device is efficient. In a second mode of operation, in which higher frequency response is desired, the control system provides a signal to the amplifiers 1305 to provide the maximum amount of amplification. When a change in signal intensity is desired the attenuators are adjusted by the control system. Since the second mode of operation relies on the attenuators to vary signal intensities, the device now supports a high frequency response. Thus, the embodiment retains the advantages of associated with using an amplifier instead of an attenuator for equalization. Clearly, different wavelength channels will support different modes of operation simultaneously. Also, other modes of operation are useful; for example, the second mode of operation is easily modified such that the amplifiers provide less than the maximum amount of gain however the device continues to rely on attenuation for signal equalization.

Further, it is a straightforward matter using present day control theory, to implement a controller that reduces power consumption by controlling high frequency needs for intensity variations using attenuation and lower frequency needs using variation in the amplification. As such, a sudden change in intensity is effected by varying the attenuation and then the amplification is varied over time in reverse relation to the attenuation in order to set that intensity level in a more power efficient fashion. Of course, such a method only allows for high frequency response through variation to the attenuation and, as such, in a preferred embodiment the amplification is adjusted to steady state values greater than the minimum required amplification in order to provide for high frequency response in amplification and attenuation of the optical signal. Controllers of this type are known, see for example the butterfly controller of Galiana disclosed in U.S. Pat. No. 5,984,475 entitled stereoscopic gaze controller. In comparison, a prior art EDFA boosts all of the optical signals regardless of their requirement for optical intensity. Thus, an EDFA will provide gain to all supported wavelength channels even if only one optical signal is to be amplified.

Since gain equalization is achieved via amplification instead of attenuation, the resulting integrated devices result in reduced losses across different channels while the resulting equalized signal is equalized nearer a maximum intensity of component signals within the input. This is particularly important for Metro applications where the costs of conventional amplification hardware or signal regeneration hardware are prohibitive and the distances are relatively short. Since this component is integrated on a substrate it is well suited to mass production and correspondingly inexpensive to produce in large quantities. These advantages are also beneficial for gaining acceptance in Metro applications.

Additionally, the semiconductor optical amplifiers may accept additional input signals from external sensors and controllers. This would allow the device to compensate for a wavelength dependant loss of other components that the optical signals have not yet propagated to. Also, one having skill in the art of active component design will be aware that a semi conductor optical amplifier works as a photodetector when operated with reverse bias. Thus, an optical amplifier serves as either a photodetector or an amplifier as required.

Those of skill in the art of signal processing will be aware that the process of amplification does not necessarily suggest that an amplified output signal have a higher intensity than the corresponding input signal provided to the amplifier. Thus an amplifier may be used to increase or decrease the intensity of an optical signal.

The figures demostrate simplified embodiments. The number of channels that are demultiplexed, amplified, and multiplexed is dependant on the technology used as compared to the required performance of the gain equalizer. The number of channels shown in the figures is in no way indicative of any limitation associated with a minimum or maximum number of supported wavelength channels.

Numerous other embodiments can be envisaged without departing from the spirit or scope of the invention.

What is claimed is:

1. A gain equaliser comprising:
   an input port for receiving an optical signal;
   a demultiplexer for demultiplexing the received optical signal into separate optical signals corresponding to predetermined wavelength channels; and,
   a plurality of semiconductor optical amplifiers for amplifying each of the separate optical signals,
   wherein the gain equaliser is integrated on a same substrate.

2. A gain equaliser according to claim 1 comprising a feedback signal port for receiving feedback signals and wherein the amplification of the plurality of amplifiers is performed in dependence upon the feedback signals.

3. A gain equalizer according to claim 1 wherein, in use, the optical amplifiers comprise a port for providing a feedback signal corresponding to the optical intensity of an optical signal propagating therein when the optical amplifier is reverse biased.

4. A gain equaliser according to claim 1 comprising monitoring elements including optical sensors for sensing light tapped from each separated optical signal, and
for providing feedback signals in dependence upon at least a characteristic of the sensed light and wherein the amplification of the plurality of optical amplifiers is performed in dependence upon the feedback signals relating to the charactersitic of each of the sensed light.

5. A gain equaliser according to claim 4 wherein characterstic is intensity.

6. A gain equaliser according to claim 4 wherein the monitoring elements are integrated on the same substrate.

7. A gain equaliser according to claim 6 wherein the demultiplexer comprises an echelle grating.

8. A gain equaliser according to claim 7 wherein the demultiplexer also forms a multiplexer for recombining the separated optical signals.

9. A gain equaliser according to claim 1 additionally comprising an output port integrated on the same substrate for providing an output wavelength multiplexed optical signal wherein the demultiplexer also forms a multiplexer for recombining the separate optical signals to form the output wavelength multiplexed optical signal.

10. A optical gain equalizer according to claim 9 comprising:
a monitoring element other than disposed on the substrate of the integrated gain equalizer for optically monitoring a portion of the separate optical signal and for providing a feedback signal indicative of an intensity of light incident thereon.

11. A optical gain equalizer according to claim 9 wherein a monitoring element is integrated on the same substrate and optically coupled for receiving a portion of one of the separate optical signals propagated from an optical amplifier from the plurality of optical amplifiers.

12. An optical gain equalizer according to claim 10 wherein the monitoring elements are disposed on a second substrate, said second substrate optically coupled to the substrate of the integrated gain equalizer.

13. A gain equaliser according to claim 7 additionally comprising a multiplexer wherein, in use, the multiplexer is for recombining the optical signals propagating from the optical amplifiers.

14. A method of variably amplifying an optical signal corresponding to specific wavelength channels within a wavelength multiplexed optical signal comprising:
receiving the wavelength multiplexed optical signal at a first port of an integrated substrate;
separating the wavelength multiplexed optical signal into optical signals corresponding to at least a specific wavelength channel;
providing energy to a plurality of semiconductor optical amplifiers; and
amplifying each optical signal corresponding to the specific wavelength channel separately and independently using at least a semiconductor optical amplifier of the plurality of semiconductor optical amplifiers.

15. A method according to claim 14 wherein all the optical elements are integrated within a same substrate.

16. A method of variably amplifying optical signals according to claim 14 additionally comprising:
providing the said amplified optical signal to a wavelength division multiplexing element provided on the same integrated substrate.

17. A method of variably amplifying optical signals according to claim 16 wherein:
the wavelength division demultiplexing element and the wavelength division multiplexing element are a same wavelength operating element.

18. A method of variably amplifying optical signals according to claim 17 wherein:
the same wavelength operating element comprises an echelle grating.

19. A method of variably amplifying optical signals according to claim 14 additionally comprising:
monitoring the optical signal prior to amplifying.

20. A method of variably amplifying optical signals according to claim 14 additionally comprising:
monitoring the optical signal after amplifying.

21. A method of variably amplifying optical signals according to claim 19 wherein monitoring is performed by an optical monitoring element external to the integrated optical substrate.

22. A method of variably amplifying optical signals according to claim 19 wherein monitoring is performed by an optical monitoring element integrated on the integrated optical substrate.

23. A method of variably amplifying optical signals according to claim 21 wherein monitoring is performed by an optical monitoring element integrated on the integrated optical substrate.

24. A gain equalizer according to claim 1 comprising:
a circulator having a first port, a second port and a third port, said circulator for receiving a first optical signal at the first port and propagating said signal to the second port and for receiving a second optical signal at the second port and propagating said second signal to the third port;
wherein the input port of the optical gain equalizer is coupled to the second port of the circulator and
wherein said demultiplexer additionally for multiplexing each of the amplified separate optical signals and for providing a multiplexed optical signal to the second port of the circulator.

25. A gain equaliser according to claim 24 comprising monitoring elements including optical sensors for sensing light tapped from each separated optical signal, and,
wherein the feedback signals are provided from monitoring elements.

26. A gain equaliser according to claim 25 wherein the monitoring elements are integrated on a same substrate as the integrated optical gain equalizer.

27. A gain equaliser according to claim 26 wherein the demultiplexer comprises an echelle grating.

28. A optical gain equalizer according to claim 24 comprising:
a monitoring element other than integrated with the integrated gain equalizer for optically monitoring a portion of the separate optical signal and for providing a feedback signal indicative of an intensity of light incident thereon.

29. A gain equalizer according to claim 24 comprising:
a second circulator having a first port, a second port and a third port, said second circulator for receiving a third optical signal at the first port of the second circulator and propagating said signal to the second port of the second circulator, said second circulator for receiving a fourth optical signal at the second port of the second circulator and propagating said fourth signal to the third port of the second circulator, said second circulator for receiving a fifth optical signal at the third port of the second circulator and propagating said fifth optical signal to the first port of the second circulator, said first circulator for receiving a sixth optical signal at the third port of the first circulator and propagating said sixth optical signal to the first port of the first circulator, a second integrated optical gain equalizer, comprising:
a second input port for receiving a second input optical signal, said second input port optically coupled to the second port of the second circulator;
a second demultiplexer for demultiplexing the received second input optical signal into a second set of separate optical signals corresponding to predetermined wavelength channels and for recombining the second set of separate optical signals; and,
a plurality of optical amplifiers for amplifying each of the second set of separate optical signals in dependence upon feedback signals relating to an intensity of each of the second set of separate optical signals, said second demultiplexer also for multiplexing each of the amplified second set of separate optical signals and for providing a multiplexed optical signal to the second input port;
wherein the third port of the first circulator is optically coupled to the third port of the second circulator.

30. A gain equaliser according to claim 29 comprising monitoring elements including optical sensors for sensing light tapped from each separated optical signal, and wherein the feedback signals are provided from monitoring elements.

31. A gain equaliser according to claim 30 wherein the monitoring elements are integrated on a same substrate as the integrated optical gain equalizer.

32. A gain equaliser according to claim 31 wherein the demultiplexer comprises an echelle grating.

33. A optical gain equalizer according to claim 29 comprising:
a monitoring element other than integrated with the integrated gain equalizer for optically monitoring a portion of the separate optical signal and for providing a feedback signal indicative of an intensity of light incident thereon.

34. A gain equalizer according to claim 24 comprising:
a second circulator having a first port, a second port and a third port, said second circulator for receiving a third optical signal at the first port of the second circulator and propagating said signal to the second port of the second circulator, said second circulator for receiving a fourth optical signal at the second port of the second circulator and propagating said second signal to the third port of the second circulator, said second circulator for receiving a fifth optical signal at the third port of the second circulator and propagating said fifth optical signal to the first port of the second circulator,
said first optical circulator for receiving a sixth optical signal at the third port of the first circulator and propagating said sixth optical signal to the first port of the first circulator,
said integrated optical gain equalizer comprising:
a second input port for receiving a second input optical signal, said second input port optically coupled to the second port of the second circulator;
said demultiplexer for demultiplexing the received second input optical signal into a second set of separate optical signals corresponding to predetermined wavelength channels and for recombining the second set of separate optical signals; and,
a second plurality of optical amplifiers for amplifying each of the second set of separate optical signals in dependence upon feedback signals relating to an intensity of each of the second set of separate optical signals,
said demultiplexer also for multiplexing each of the amplified second set of separate optical signals and for providing a multiplexed optical signal to the second input port;
wherein the third port of the first circulator is optically coupled to the third port of the second circulator.

35. A gain equaliser according to claim 34 comprising monitoring elements including optical sensors for sensing light tapped from each separated optical signal, and
wherein the feedback signals are provided from monitoring elements.

36. A gain equaliser according to claim 35 wherein the monitoring elements are integrated on a same substrate as the integrated optical gain equalizer.

37. A gain equaliser according to claim 36 wherein the demultiplexer comprises an echelle grating.

38. An optical gain equalizer according to claim 34 comprising:
a monitoring element other than integrated with the integrated gain equalizer for optically monitoring a portion of the separate optical signal and for providing a feedback signal indicative of an intensity of light incident thereon.

39. A gain equalizer according to claim 24 comprising:
a second circulator having a first port, a second port and a third port, said second circulator for receiving a third optical signal at the first port of the second circulator and propagating said signal to the second port of the second circulator, said second circulator for receiving a fourth optical signal at the second port of the second circulator and propagating said second signal to the third port of the second circulator, said second circulator for receiving a fifth optical signal at the third port of the second circulator and propagating said fifth optical signal to the first port of the second circulator,
said first optical circulator for receiving a sixth optical signal at the third port and propagating said sixth optical signal to the first port,
a second integrated optical gain equalizer, comprising:
a second input port for receiving a second input optical signal, said second input port optically coupled to the second port of the second circulator;
a second demultiplexer for demultiplexing the received second input optical signal into a second set of separate optical signals corresponding to predetermined wavelength channels and for recombining the second set of separate optical signals; and,
a plurality of optical amplifiers for amplifying each of the second set of separate optical signals in dependence upon feedback signals relating to an intensity of each of the second set of separate optical signals,
said second demultiplexer also for multiplexing each of the amplified second set of separate optical signals and for providing a multiplexed optical signal to the second input port;
wherein the third port of the first circulator is optically coupled to the third port of the second circulator and, the first integrated optical gain equalizer and the second integrated optical gain equalizer are integrated on a same substrate.

40. A gain equaliser according to claim 39 comprising monitoring elements including optical sensors for sensing light tapped from each separated optical signal, and
wherein the feedback signals are provided from monitoring elements.

41. A gain equaliser according to claim 40 wherein the monitoring elements are integrated on a same substrate as the integrated optical gain equalizer.

42. A gain equaliser according to claim 41 wherein the demultiplexer comprises an echelle grating.

43. A optical gain equalizer according to claim 39 comprising:
a monitoring element other than integrated with the integrated gain equalizer for optically monitoring a portion of the separate optical signal and for providing a feedback signal indicative of an intensity of light incident thereon.

44. A gain equalizer according to claim 24 comprising:
a second integrated optical gain equalizer, comprising:
a second input port for receiving a second input optical signal,;
a second demultiplexer for demultiplexing the received second input optical signal into a second set of separate optical signals corresponding to predetermined wavelength channels and for recombining the second set of separate optical signals; and,
a plurality of optical amplifiers for amplifying each of the second set of separate optical signals in dependence upon feedback signals relating to an intensity of each of the second set of separate optical signals,
said second demultiplexer also for multiplexing each of the amplified second set of separate optical signals and for providing a multiplexed optical signal to the second input port;
said first circulator having a fourth port, said circulator for receiving a third optical signal at the third port and propagating said third optical signal to the fourth port, said circulator for receiving a fourth optical signal at the fourth port and propagating said fourth optical signal to the first port,
wherein said fourth port of the circulator is optically coupled to the second input port.

45. A gain equaliser according to claim 44 comprising monitoring elements including optical sensors for sensing light tapped from each separated optical signal, and
wherein the feedback signals are provided from monitoring elements.

46. A gain equaliser according to claim 45 wherein the monitoring elements are integrated on a same substrate as the integrated optical gain equalizer.

47. A gain equaliser according to claim 46 wherein the demultiplexer comprises an echelle grating.

48. A optical gain equalizer according to claim 44 comprising:
a monitoring element other than integrated with the integrated gain equalizer for optically monitoring a portion of the separate optical signal and for providing a feedback signal indicative of an intensity of light incident thereon.

49. A gain equalizer according to claim 24 comprising:
a second integrated optical gain equalizer, comprising:
a second input port for receiving a second input optical signal,;
a second demultiplexer for demultiplexing the received second input optical signal into a second set of separate optical signals corresponding to predetermined wavelength channels and for recombining the second set of separate optical signals; and,
a plurality of optical amplifiers for amplifying each of the second set of separate optical signals in dependence upon feedback signals relating to an intensity of each of the second set of separate optical signals,
said second demultiplexer also for multiplexing each of the amplified second set of separate optical signals and for providing a multiplexed optical signal to the second input port;
said first circulator having a fourth port, said circulator for receiving a third optical signal at the third port and propagating said third optical signal to the fourth port, said circulator for receiving a fourth optical signal at the fourth port and propagating said fourth optical signal to the first port,
wherein said fourth port of the circulator is optically coupled to the second input port and,
the first integrated optical gain equalizer and the second integrated optical gain equalizer are integrated on a same substrate.

50. A gain equaliser according to claim 49 comprising monitoring elements including optical sensors for sensing light tapped from each separated optical signal, and
wherein the feedback signals are provided from monitoring elements.

51. A gain equaliser according to claim 50 wherein the monitoring elements are integrated on a same substrate as the integrated optical gain equalizer.

52. A gain equaliser according to claim 51 wherein the demultiplexer comprises an echelle grating.

53. A optical gain equalizer according to claim 49 comprising:
a monitoring element other than integrated with the integrated gain equalizer for optically monitoring a portion of the separate optical signal and for providing a feedback signal indicative of an intensity of light incident thereon.

54. A gain equalizer according to claim 24 wherein:
said integrated optical gain equalizer comprising:
a second input port for receiving a second input optical signal;
said demultiplexer for demultiplexing the received second input optical signal into a second set of separate optical signals corresponding to predetermined wavelength channels and for recombining the second set of separate optical signals; and,
a second plurality of optical amplifiers for amplifying each of the second set of separate optical signals in dependence upon feedback signals relating to an intensity of each of the second set of separate optical signals,
said demultiplexer also for multiplexing each of the amplified second set of separate optical signals and for providing a multiplexed optical signal to the second input port;
said first circulator having a fourth port, said circulator for receiving a third optical signal at the third port and propagating said third optical signal to the fourth port, said circulator for receiving a fourth optical signal at the fourth port and propagating said fourth optical signal to the first port,
wherein said fourth port of the circulator is optically coupled to the second input port.

55. A gain equaliser according to claim 54 comprising monitoring elements including optical sensors for sensing light tapped from each separated optical signal, and wherein the feedback signals are provided from monitoring elements.

56. A gain equaliser according to claim 55 wherein the monitoring elements are integrated on a same substrate as the integrated optical gain equalizer.

57. A gain equaliser according to claim 56 wherein the demultiplexer comprises an echelle grating.

58. A optical gain equalizer according to claim 54 comprising:

a monitoring element other than integrated with the integrated gain equalizer for optically monitoring a portion of the separate optical signal and for providing a feedback signal indicative of an intensity of light incident thereon.

* * * * *